United States Patent [19]

Bart et al.

[11] 4,322,664
[45] Mar. 30, 1982

[54] VERTICAL RAMP GENERATOR FOR A TELEVISION RECEIVER

[75] Inventors: Stan Bart, Hoffman Estates; George J. Tzakis, Glenview, both of Ill.

[73] Assignee: Zenith Radio Corporation, Glenview, Ill.

[21] Appl. No.: 184,718

[22] Filed: Sep. 8, 1980

[51] Int. Cl.³ .................... H01J 29/70; H01J 29/76
[52] U.S. Cl. .................................................. 315/408
[58] Field of Search ........................ 315/396, 397, 408

[56] References Cited

U.S. PATENT DOCUMENTS 4,023,069 5/1977 Peer ..................................... 315/397

*Primary Examiner*—Theodore M. Blum

[57] ABSTRACT

A ramp generator is described for developing a ramp voltage for use in vertically deflecting the electron beam or beams of a television receiver. The ramp generator receives a vertical rate pulse developed by the receiver for developing a charging current during the occurrence of the vertical rate pulse. A discharging current is also generated, and both currents are applied to a capacitor for developing a ramp voltage which increases and then decreases in amplitude. A clamp circuit in the generator is enabled when the vertical pulse is received for clamping the ramp voltage on the capacitor to a predetermined peak voltage via low impedance path such that unwanted voltage components are substantially eliminated from the ramp voltage during the clamping action.

8 Claims, 3 Drawing Figures

VERTICAL RAMP GENERATOR FOR A TELEVISION RECEIVER

BACKGROUND OF THE INVENTION

This invention is directed generally to improvements in television receivers, and particularly to a vertical ramp generator for use in such a receiver.

Television receivers typically include a cathode ray tube which scans both vertically and horizontally to develop an interlaced raster. Vertical scan is usually effected by applying a vertical drive signal to a yoke which is coupled to the neck of the picture tube.

To develop the vertical drive signal, a ramp generator may be employed whose function is to charge and discharge a capacitor so as to develop a ramp voltage across the capacitor. The latter voltage may be processed and applied to the yoke for effecting trace and retrace of the receiver's vertical scan.

Among the factors to be considered in developing the ramp voltage is the peak current required to charge the capacitor, the linearity of the ramp, and its freedom from undesired components which impair interlace. Prior ramp generators have generally presented difficulties on one or more of these areas. For example, some ramp generators have required high peak charging currents which place an undesirably high load on the receiver's power supply. Others have generated ramp voltages which include horizontal and vertical rate components which make good interlace very difficult to achieve. The present invention overcomes these problems with a ramp generator which is particularly adapted for construction in integrated circuit form.

OBJECTS OF THE INVENTION

It is a general object of the invention to provide an improved vertical ramp generator for use in a television receiver.

It is a more specific object of the invention to provide a vertical ramp generator whose ramp voltage provides a high degree of interlace.

It is another object of the ivention to provide such a ramp generator which requires a relatively low peak charging current and whose ramp voltage is substantially linear.

BRIEF DESCRIPTION OF THE FIGURES

The objects stated above and other objects of the invention are set forth with more particularity in the detailed description below and in the accompanying drawings, of which.

DESCRIPTION OF THE PREFERRED EMBODIMENT

Figure 1:
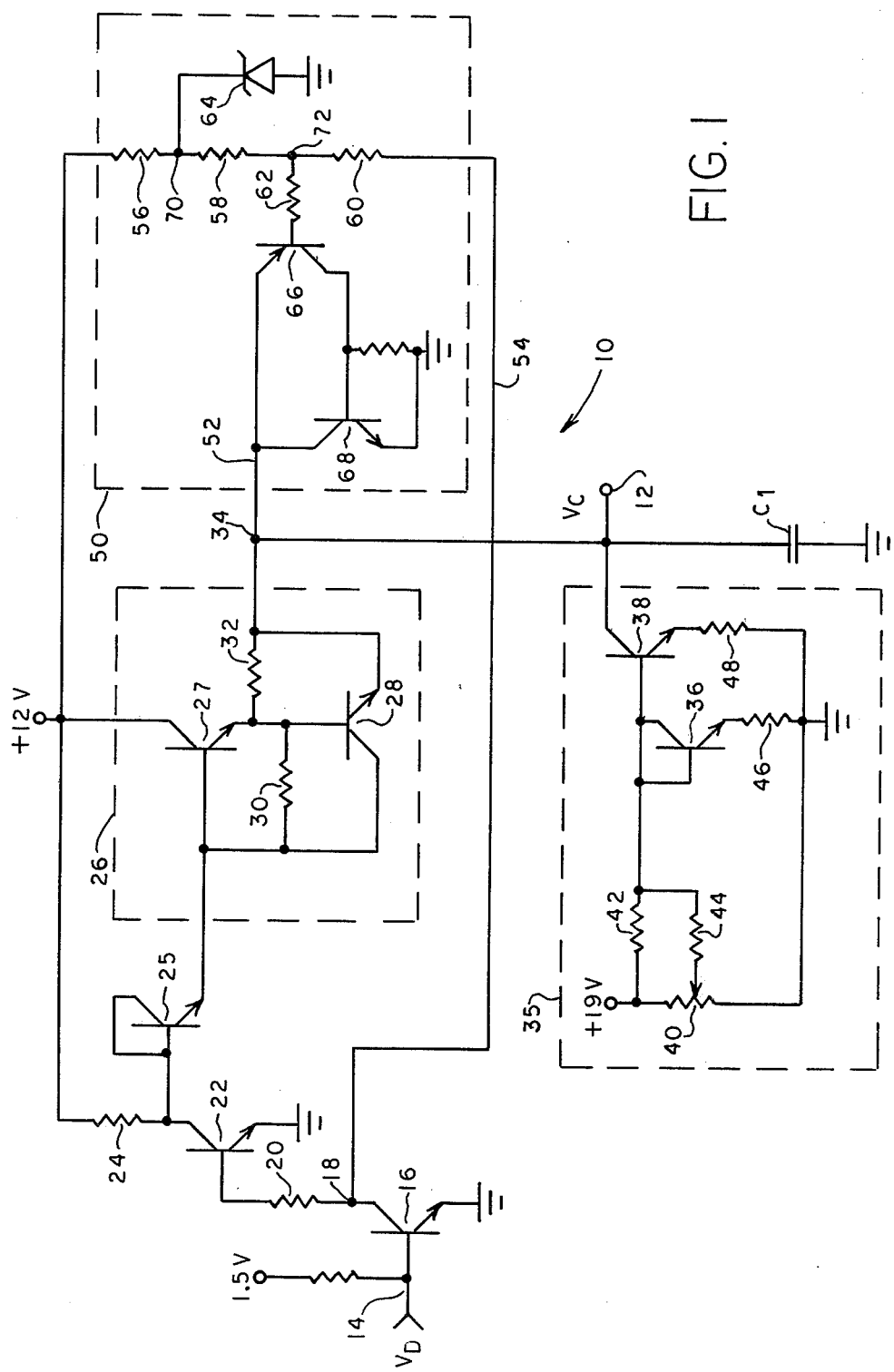
FIG. 1 is a circuit diagram of a ramp generator in accordance with the invention.
Figure 3:
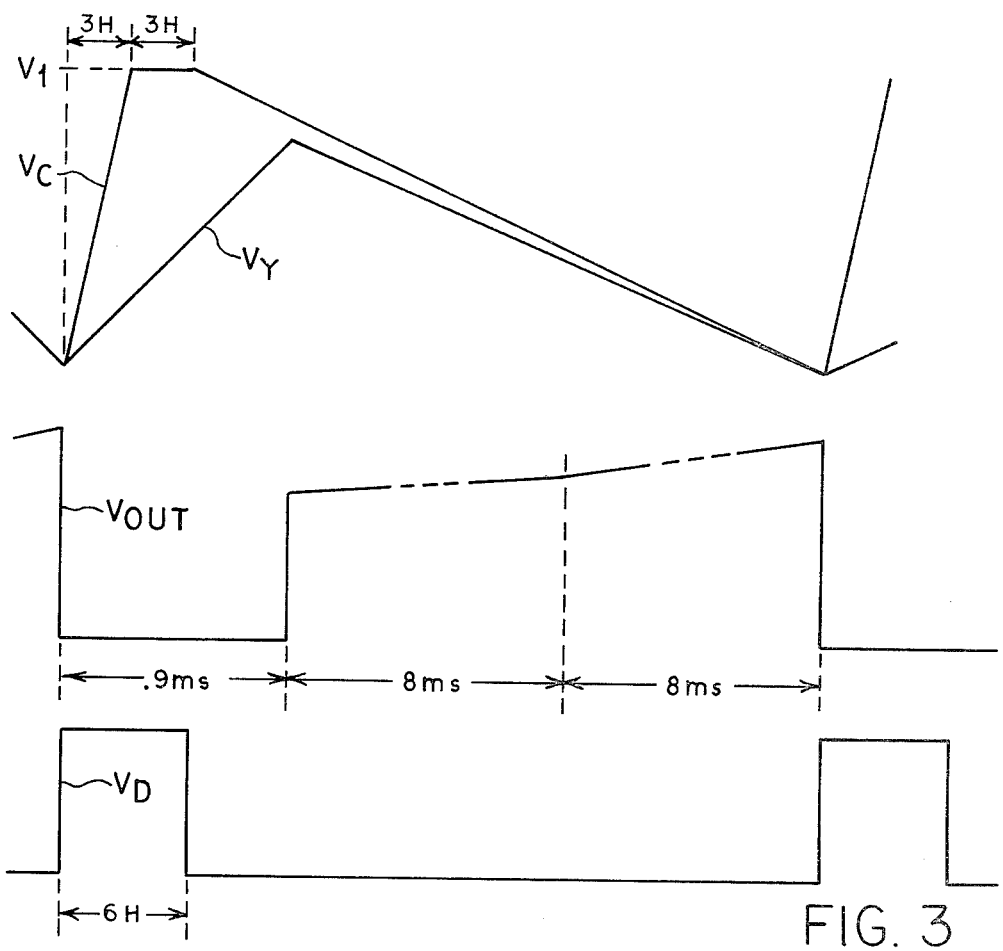
FIG. 3 shows waveforms of various voltages which are generated by the circuitry shown in FIGS. 1 and 2.

Referring now to FIG. 1, a ramp generator 10 is shown for developing a ramp voltage $V_c$ at an output terminal 12 in response to a vertical rate pulse $V_d$ received at an input 14. FIG. 3 shows illustrative waveforms associated with the vertical input pulse $V_d$ and the ramp output voltage $V_c$. In this illustrated embodiment, the vertical input pulse $V_d$ has an on-time of 6H, where H is equal to the duration of on horizontal line interval, and has a period of approximately 16.9 milliseconds.

The vertical input pulse may be generated by any conventional circuitry, such as by a so-called vertical count-down circuit which receives the output of a high frequency oscillator and divides that output by an integer selected to provide the proper frequency for the pulse $V_d$.

The input pulse is applied to an inverting driver transistor 16 whose emitter is grounded so that the latter transistor saturates when the input pulse is high. When the input pulse is low, the transistor 16 turns off, thereby developing at its collector node 18 an output pulse in the form of an inverted vertical input pulse.

The output pulse at the node 18 is coupled via a resistor 20 to the base of an inverter transistor 22 whose emitter is grounded and whose collector is coupled to a 12 volt supply voltage via a resistor 24. Thus, when the input pulse $V_d$ is high, the voltage at node 18 is low and the voltage at the collector of the transistor 22 is high.

Coupled to the collector of the transistor 22 is another transistor 25 whose collector is coupled to its base for operating as a diode. The emitter of the latter transistor is coupled to a constant current generator 26 comprising transistors 27 and 28 and resistors 30 and 32. The illustrated constant current generator is conventional and operates to develop a substantially constant charging current $I_1$ flowing toward a node 34 whenever the pulse at node 18 goes low. The current $I_1$ terminates when the pulse at node 18 goes high. Stated another way, the current $I_1$ is generated while the signal $V_d$ is high.

Coupled to the node 34 is a capaitor $C_1$ and another constant current generator 35 comprising transistors 36 and 38, a variable resistor 40, and fixed resistors 42, 44, 46 and 48. The transistor 38 develops a substantially constant current $I_2$ which is smaller in value than the current $I_1$ and which flows away from the node 34 so that a net current, $I_1-I_2$, charges the capacitor $C_1$ with an increasing ramp voltage.

As indicated in FIG. 3, such charging of the capacitor $C_1$ occurs during the first 3H interval of the input signal $V_d$. As described in more detail hereinafter, the voltage $V_c$ remains clamped at its peak voltage $V_1$ for the second 3H interval and decreases substantially linearly when the signal $V_d$ is low.

Referring again to the current generator 35, this generator is in an on condition continuously so that, when the current generator 26 is off, the current $I_2$ discharges the capacitor $C_1$ at a constant rate while the signal $V_d$ is low. The latter rate may be varied by adjusting the resistor 40 so that the receiver's picture may be adjusted to its proper size.

In order to limit the peak amplitude of the voltage $V_c$ to the value $V_1$, a clamp circuit 50 is coupled to the node 34 via a lead 52 and to the driver 16 via another lead 54. In general, the clamp 50 responds to the input pulse $V_d$ for clamping the ramp voltage on the capacitor $C_1$ to the peak voltage $V_1$ via a low impedance path such that unwanted voltage components are substantially eliminated from the ramp voltage $V_c$ during the clamping action; the clamp 50 then responds to the termination of the pulse $V_d$ for quickly releasing the clamp so that the ramp voltage $V_c$ decreases substantially linearly in response to the discharging current provided by the current generator 35.

In the illustrated embodiment, the clamp 50 includes resistors 56, 58, 60 and 62, a zener diode 64 and a pair of resistors 66 and 68. The resistor 56 has one end coupled to the 12 volt supply voltage and the other end coupled to a node 70. The zener diode 46 is coupled between the node 70 and ground so as to develop a D.C. potential at node 70 of about 6 volts. The resistor 58 is coupled from the node 70 to another node 72, and the resistor 60 is coupled between nodes 18 and 72.

The transistor 66 is a PNP transistor, and, because the ramp generator is designed to be constructed as an integrated circuit, the latter transistor typically has a low current gain. Therefore, the high gain NPN transistor 68 is interconnected as shown with the transistor 66 to form a composite, high gain, PNP transistor whose emitter is coupled to the node 34 and whose base is coupled o the node 72 via the resistor 62.

The operation of the clamp 50 is best described by first assuming that the transistor 16 has been turned on by the signal $V_d$. In that situation, the node 18 is near ground potential and the resistors 58 and 60 form a voltage divider between nodes 18 and 70 for developing a potential of about 4 volts at the node 72. When the current $I_1$ first begins, the capacitor $C_1$ starts charging, but the increasing voltage at the node 34 is sufficiently lower than the voltage at node 72 so that the composite transistor 66-68 remains off.

As the voltage $V_c$ at node 34 reaches about 4.7 volts, the composite transistor 66-68 turns on hard, thereby clamping the voltage $V_c$ to 4.7 volts ($V_1$ in FIG. 3). The voltage $V_c$ remains clamped until the input signal $V_d$ goes low.

When the input signal $V_d$ goes low, the transistor 16 turns off, and the transistor 22 turns on. Consequently, the voltage at node 72 rises abruptly to about 5.5 volts due to the voltage divider effect of resistors 58, 60 and 20 and the forward $V_{be}$ drop associated with the transistor 22. Because the voltage at node 72 is now higher than the voltage ($V_c$) at node 34, the transistors 66 and 68 are quickly turned off. As a result, the capacitor $C_1$ is now discharged by the current $I_2$ to develop a decreasing ramp voltage.

Several advantages accrue as a result of the structure described above. Because of the zener diode 64, a very low impedance path to ground from the node 70 is provided for undesired voltage perturbations carried or picked up by the supply voltage. Thus, horizontal and vertical rate components which might otherwise appear at the node 70 and in the clamp voltage at node 34 are substantially eliminated. Additional filtering is supplied by the composite PNP transistor 66-68 because the high gain transistor 68 provides a very low impedance path between round and the node 34 to further eliminate any horizontal and vertical rate components which could otherwise affect the clamp voltage at node 34. Hence, interlace is improved.

An additional advantage of the ramp generator 10 is the relatively low peak current employed for charging the capacitor $C_1$. In the illustrated embodiment, a peak charging current of about 5 milliamperes flows for about 190 microseconds (3H). To achieve this level of charging current, the resistor 32 is selected to have a resistance of about 140 ohms. In contrast, some conventional ramp generators require a peak charging current of approximately 300 milliamperes for 10 to 20 microseconds, thereby requiring a larger capacity power supply.

Figure 2:
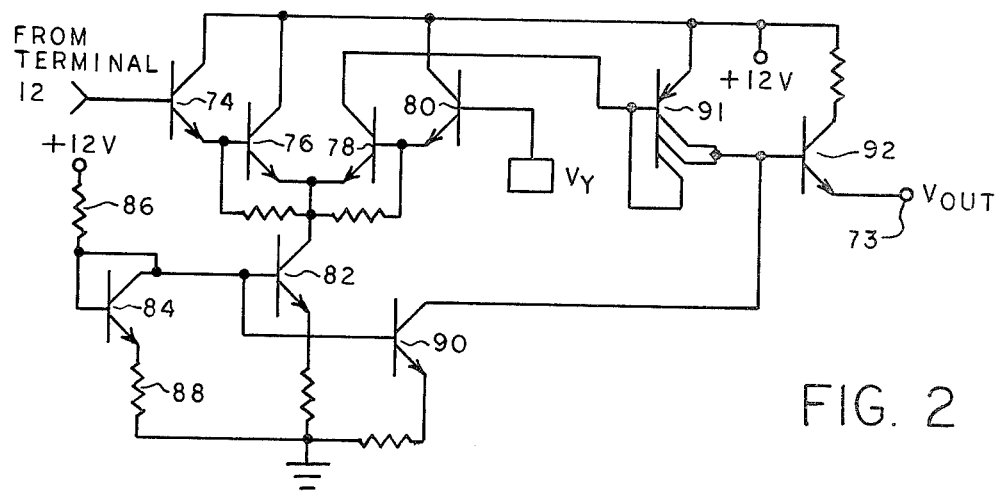
FIG. 2 illustrates an exemplary circuit for coverting the ramp voltage generated by the circuit of FIG. 1 to a vertical drive signal.

Typically, the ramp voltage $V_c$ is further processed to develop a vertical drive signal for application to a yoke. FIG. 2 illustrates an exemplary circuit which receives the signal $V_c$ from terminal 12 for developing a vertical drive signal Vout at an output terminal 73.

The illustrated circuit includes a comparator comprising transistors 74, 76, 78 and 80, a current source transistor 82, a biasing source comprising a transistor 84 and resistors 86 and 88, a pull-down transistor 90, a turn-around transistor 91, and an output transistor 92. The comparator receives the ramp voltage $V_c$ at the base of transistor 74 and a signal $V_y$ (see FIG. 3) which is representative of yoke current. During retrace, the signal $V_c$ is much larger than the signal $V_y$, wherefore the transistors 78 and 91 are off and the transistor 90 saturates. Consequently, the voltage Vout goes low and remains low for about 0.9 milliseconds. Immediately thereafter, the transistor 78 becomes conductive, the transistor 91 supplies current to the output transistor 92, and the transistor 90 comes out of saturation. Consequently, the transistor 92 develops an output voltage, as shown in FIG. 3, which is a function of the difference between the voltages $V_c$ and $V_y$. That output voltage may be coupled to a yoke driver for vertically deflecting the electron beam or beams of the receiver's cathode ray tube.

Although the ramp generator has been described in terms of a preferred embodiment which has been designed for construction as an integrated circuit, it will be obvious to those skilled in the art that many alterations and modifications thereto may be made without departing from the invention. By way of example only, the composite PNP 66-68 may be replaced by a single high gain, PNP transistor, and the constant current generators 26 and 35 may be replaced by any suitable generators. Other such modifications will be obvious in light of the disclosure above. Accordingly, it is intended that all such modifications and alterations be included within the spirit and scope of the invention as defined by the appended claims.

What is claimed is:

1. In a television receiver having means for generating a vertical rate pulse, and having a ramp generator responsive to the vertical rate pulse for generating a ramp voltage for use in developing a vertical deflection signal, an improved ramp generator comprising:

means responsive to the vertical rate pulse for generating a charging current for the duration of the vertical rate pulse;

means for generating a discharging current whose value is less than the value of the charging current;

a capacitor receiving the charging and discharging current for developing a ramp voltage; and a clamp circuit coupled to said capacitor and enabled on the occurrence of the vertical rate pulse for clamping the ramp voltage on the capacitor to a predetermined peak voltage via a low impedance path such that unwanted voltage components are substantially eliminated from the ramp voltage during the clamping action, and responsive to the termination of the vertical rate pulse for quickly releasing the clamp so that the ramp voltage decreases substantially linearly in response to the discharging current.

2. A ramp generator as set forth in claim 1 wherein said clamp circuit includes a high gain transistor coupled between ground and said capacitor, means for developing and applying to said transistor a filtered bias voltage to hold said transistor off, and further including means responsive to the vertical rate pulse for modifying the bias voltage to permit said transistor to conduct when the ramp voltage is substantially equal to the predetermined peak voltage.

3. A ramp generator as set forth in claim 1 wherein said means for developing the bias voltage includes a zener diode coupled between ground and a supply voltage to provide the bias voltage from which horizontal and vertical rate components are substantially eliminated.

4. A ramp generator as set forth in laim 2 wherein said means for modifying the bias voltage includes a driver transistor receiving the vertical rate pulse at its base, wherein said means for developing the filtered bias voltage includes a resistive network coupled between a supply voltage and the collector of said driver transistor such that, when the driver transistor receives the vertical rate pulse, it conducts heavily to lower the bias voltage so that said high gain transistor can conduct when the ramp voltage exceeds said peak voltage.

5. A ramp generator as set forth in claim 4 wherein said means for generating a charging current includes a constant current generator, and wherein said generator is enabled by said driver transistor on the latter's receipt of the vertical rate pulse.

6. In a television receiver having means for generating a vertical rate pulse, and having a ramp generator responsive to the vertical rate pulse for generating a rmap voltage for use in developing a vertical deflection signal, an improved ramp generator comprising:

a driver responsive to the vertical pulse for developing an output pulse whose duration corresponds to the duration of the vertical pulse;

a first current generator coupled to said driver for developing a substantailly constant charging current for the duration of the output pulse;

a second current generator for developing a substantially constant discharging current whose value is less than the value of the charging current;

a capacitor receiving the charging and discharging current for developing an increasing ramp voltage in response to the difference between the charging current and the discharging current, and for developing a decreasing ramp voltage in response to the discharging current; and a clamp circuit coupled to said driver and to said capacitor, and responsive to the output pulse developed by the driver for clamping the ramp voltage on the capacitor to a predetermined peak voltage via a low impedance path such that unwanted voltage components are substantially eliminated from the ramp voltage during the clamping action, and responsive to the termination of the output pulse for quickly releasing the clamp so that the ramp voltage decreases substantially linearly in response to the discharging current provided by said second current generator.

7. A ramp generator as set forth in claim 6 wherein said clamp circuit includes a high gain transistor coupled between said capacitor and ground, a zener diode coupled between a supply voltage and ground for developing a filtered voltage, a voltage divider network receiving the latter voltage and being coupled to said driver and to said transistor such that, when the driver's output pulse is absent, a bias voltage is applied to said transistor for holding it off and, when the driver's output pulse is present, the bias voltage is altered to permit said transistor to conduct when the ramp voltage reaches said predetermined peak voltage.

8. A ramp generator as set forth in claim 7 wherein said transistor is a composite PNP transistor.

* * * * *